(12) United States Patent
Li

(10) Patent No.: US 9,998,127 B2
(45) Date of Patent: Jun. 12, 2018

(54) CLOCK CIRCUIT AND CONTROL METHOD THEREOF

(71) Applicant: Monolithic Power Systems, Inc., San Jose, CA (US)

(72) Inventor: Lei Li, Chengdu (CN)

(73) Assignee: Monolithic Power Systems, Inc., San Jose, CA (US)

( * ) Notice: Subject to any disclaimer, the term of this patent is extended or adjusted under 35 U.S.C. 154(b) by 0 days. days.

(21) Appl. No.: 15/464,201

(22) Filed: Mar. 20, 2017

(65) Prior Publication Data

US 2017/0279454 A1    Sep. 28, 2017

(30) Foreign Application Priority Data

Mar. 22, 2016   (CN) .......................... 2016 1 0165791

(51) Int. Cl.
*H03L 7/089* (2006.01)
*G06F 1/04* (2006.01)
*H03L 5/00* (2006.01)

(52) U.S. Cl.
CPC .............. *H03L 7/0891* (2013.01); *H03L 5/00* (2013.01)

(58) Field of Classification Search
CPC combination set(s) only.
See application file for complete search history.

(56) References Cited

U.S. PATENT DOCUMENTS 7,405,627 B2 *   7/2008   Shimomura ............ H03L 7/093
                                                          331/17
9,231,574 B2     1/2016   Nguyen et al.

OTHER PUBLICATIONS

U.S. Appl. No. 13/104,855, filed May 10, 2011, Monolithic Power Systems, Inc.
U.S. Appl. No. 14/630,215, filed Feb. 24, 2015, Chengdu Monolithic Power Systems Co., Ltd.

* cited by examiner

*Primary Examiner* — An Luu
(74) *Attorney, Agent, or Firm* — Perkins Coie LLP

(57) ABSTRACT

A clock circuit and control method thereof to avoid missing the clock signal generated by the clock circuit when the generated clock signal is synced with an external clock signal, wherein the clock circuit comprises a current compensation circuit and a current control circuit. The clock signal is generated by alternately charging and discharging a capacitor with a charging current based on a sync current and a compensating current when an external clock signal is detected. The compensating current is generated based on a frequency of the external clock signal, and the sync current is provided based on a phase difference between the generated clock signal by the clock circuit and the external clock signal.

14 Claims, 3 Drawing Sheets

CLOCK CIRCUIT AND CONTROL METHOD THEREOF

CROSS-REFERENCE TO RELATED APPLICATION

This application claims priority to and the benefit of CN Patent Application No. 201610165791.2, filed Mar. 22, 2016, which is incorporated herein by reference in its entirety.

TECHNICAL FIELD

The present invention generally relates to electrical circuits, and more particularly but not exclusively relates to clock circuits.

BACKGROUND

A voltage converter converts an input voltage into a desired output voltage with control to the duty ratio of its switches, and the switching frequencies of the voltage converter are typically determined by a clock circuit. In some applications, clock signals generated by the clock circuit may either be regulated by discrete resistors or be synchronized with an external clock signal. Here lies a problem, however, that a voltage drop at the output terminal of the voltage converter will occur at the moment the clock signal is synced with the external clock signal. Consequently, an improved clock circuit is needed which can steady the output voltage of the voltage converter when clock signals are shifted.

SUMMARY OF THE INVENTION

The present invention provides a clock circuit comprising a current compensation circuit and method thereof to avoid missing a clock signal generated by the clock circuit when the generated clock signal is synced with an external clock signal. When the external clock signal is detected, a compensating current is generated based on a frequency of the external clock signal, so as to provide enough charging current to charge a capacitor for generating the clock signal. Thus, output voltage drop of a voltage converter adopting the clock circuit is avoided too.

There has been provided, in accordance with an embodiment of the present invention, a clock circuit comprising: a current source, having a frequency control terminal and an output terminal, wherein when the frequency control terminal is coupled to a resistor, the output terminal provides a reference current with a value related to a resistance of the resistor; a phase lock loop (PLL), having a first input terminal configured to receive a first clock signal, a second input terminal configured to receive a second clock signal, a control terminal configured to receive a sync selecting signal, and an output terminal configured to provide a sync current based on the first clock signal, the second clock signal and the sync selecting signal; a current compensation circuit, having a first input terminal configured to receive the first clock signal, a second input terminal configured to receive the second clock signal, a control terminal configured to receive the sync selecting signal, and an output terminal configured to provide a compensating current based on the first clock signal, the second clock signal and the sync selecting signal; and a current control circuit, having a first input terminal coupled to the output terminal of the current source to receive the reference current, a second input terminal coupled to the output terminal of the PLL to receive the sync current, a third input terminal coupled to the output terminal of the current compensation circuit to receive the compensating current, a control terminal configured to receive the sync selecting signal, and an output terminal configured to provide the charging current based on the reference current when the sync selecting signal is invalid, and to provide the charging current based on the sync current and the compensating current when the sync selecting signal is valid.

There has been provided, in accordance with an embodiment of the present invention, a method of controlling a clock circuit for generating a first clock signal, wherein the clock circuit comprises a frequency control terminal configured to either be coupled to a resistor or receive a second clock signal, comprising: detecting whether the second clock signal is received, if the second clock signal is received, the sync selecting signal is valid, otherwise the sync selecting signal is invalid; when the sync selecting signal is invalid, generating a compensating current based on a frequency of the first clock signal, and providing a reference current with a value related to a resistance of the resistor to charge a capacitor of the clock circuit; when the sync selecting signal is valid, generating a compensating current based on the second clock signal, generating a sync current based on a phase difference between the first clock signal and the second clock signal, and providing both of the sync current and the compensating current to charge the capacitor of the clock circuit; comparing a voltage across the capacitor with a reference voltage to generate a comparison signal; providing the comparison signal to a pulse circuit to generate the first clock signal; and discharging the capacitor based on the first clock signal.

There has been provided, in accordance with an embodiment of the present invention, a clock circuit comprising: a resistor, having a first terminal coupled to a ground reference, and a second terminal; a current source, having a frequency control terminal coupled to the second terminal of the resistor, and an output terminal configured to provide a reference current with a value related to the resistance of the resistor; a phase lock loop (PLL), having a first input terminal configured to receive a first clock signal, a second input terminal configured to receive a second clock signal, a control terminal configured to receive a sync selecting signal, and an output terminal configured to provide a sync current based on the first clock signal, the second clock signal and the sync selecting signal; a current compensation circuit, having a first input terminal configured to receive the first clock signal, a second input terminal configured to receive the second clock signal, a control terminal configured to receive the sync selecting signal, and an output terminal configured to provide a compensating current based on the first clock signal, the second clock signal and the sync selecting signal; and a current control circuit, having a first input terminal coupled to the output terminal of the current source to receive the reference current, a second input terminal coupled to the output terminal of the PLL to receive the sync current, a third input terminal coupled to the output terminal of the current compensation circuit to receive the compensating current, a control terminal configured to receive the sync selecting signal, and an output terminal configured to provide the charging current based on the reference current when the sync selecting signal is invalid, and to provide the charging current based on the sync current and the compensating current when the sync selecting signal is valid.

BRIEF DESCRIPTION OF THE DRAWINGS

For a purpose of better understanding of the present invention, a detailed description will be given in accordance with the drawings below.

DETAILED DESCRIPTION

Description in detail will be given to the specific embodiments of the present invention, and it should be noted that the embodiments here are exemplary, not to confine the scope of the invention. In the present disclosure, numerous specific details are provided for a thorough understanding of the embodiments for the invention. Persons of ordinary skill in the art will recognize, however, that the invention can be practiced without one or more of the specific details and embodied in various forms, not to be deemed limited to the embodiment set forth here. In other instances, well-known methods, procedures, components, and circuits have not been described in detail so as not to unnecessarily obscure aspects of the present invention. It should be understood, moreover, that the drawings are for illustration and not necessarily in scale.

In the entire specifications, the phrases "an embodiment", "the embodiment", "an example", "the example" are meaning that the specific features, structures and characteristics described in conjunction with this embodiment or example are included in at least one embodiment of the present invention. Consequently, the phrases "an embodiment", "the embodiment", "an example", "the example" in any paragraphs and lines of the entire specifications, are not necessarily indicated to the same embodiments or examples. Furthermore, the specific features, structures and characteristics can be integrated into one or more embodiments or examples through any suitable combination and/or sub-combination. The term "and/or" comprise any or the all combinations in one or more concerning listed items.

The phrase "connect" or "couple" refers to direct connection or indirect connection via interim media. On the contrary, the phrase "direct connect" or "direct coupling" refers to direct connection without interim media.

The same reference label in different drawings indicates the same or like components.

Figure 1:
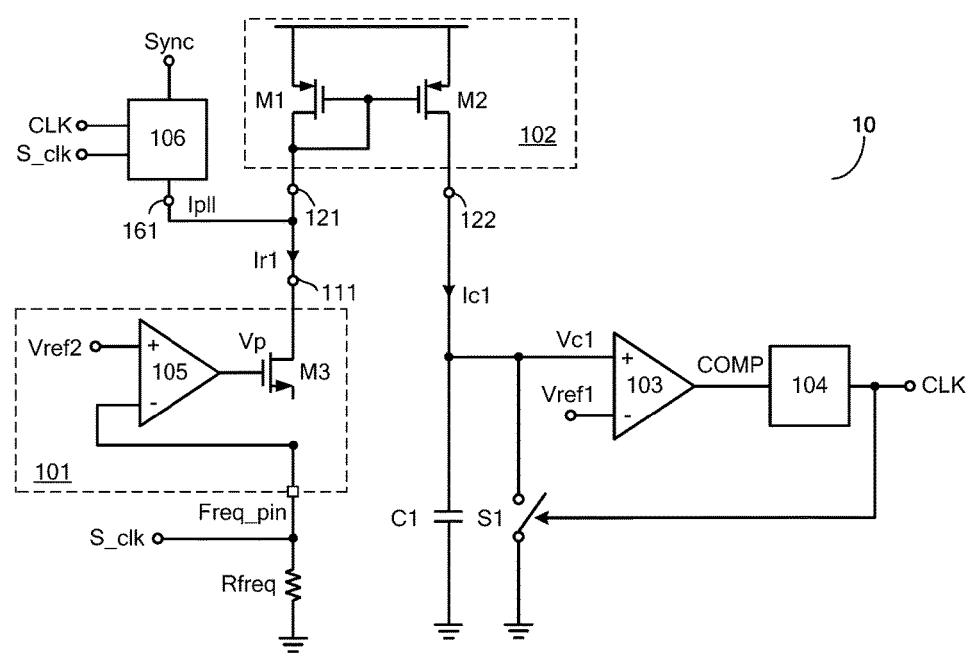
FIG. 1 schematically shows a prior art clock circuit 10.

FIG. 1 schematically shows a prior art clock circuit 10. As shown in the example of FIG. 1, the clock circuit 10 comprises: a current source 101, a phase lock loop (PLL) 106, a current mirror 102, a capacitor C1, a discharging switch S1 configured in parallel with the capacitor C1, a comparator 103 and a pulse circuit 104. The current mirror 102 comprises MOSFETs M1 and M2, an input terminal 121 configured to receive a reference current Ir1, and an output terminal 122 configured to provide a charging current Ic1 proportional to the reference current Ir1 to charge the capacitor C1, so as to build a voltage Vc1 across the capacitor C1. When the voltage Vc1 across the capacitor C1 increases to the value of a first reference voltage Vref1, the comparator 103 flips to high, and generates a high level comparison signal COMP to the pulse circuit 104. Based on the comparison signal COMP to the pulse circuit 104 generates a first clock signal CLK. The first clock signal CLK turns on the discharging switch S1 to discharge the capacitor C1. When the voltage Vc1 across the capacitor C1 decreases to the value of the first reference voltage Vref1, the comparator 103 flips to low, and the high level pulse of the comparison signal COMP ends. The pulse of the first clock signal CLK is started by the pulse of the comparison signal COMP and a pulse length of the first clock signal CLK is determined by the pulse circuit 104. When the pulse length of the first clock signal CLK ends, the discharging switch S1 is turned off and the capacitor C1 is charged. The comparator 103 flips to high and starts the pulse of the clock signal CLK again. Then the operation repeats.

As shown in the example of FIG. 1, the current source 101 has a frequency control terminal Freq_pin and comprises: an error amplifier 105, having a first input terminal configured to receive a second reference voltage Vref2, a second input terminal coupled to the frequency control terminal Freq_pin, and an output terminal configured to provide an amplified signal Vp based on the second reference voltage Vref2 and a signal at the frequency control terminal Freq_pin; and a MOSFET M3, having a first terminal coupled to the output terminal 111 of the current source 101, a second terminal coupled to the frequency control terminal Freq_pin, and a control terminal coupled to the output terminal of the error amplifier 105.

In typical applications, the clock circuit 10 is integrated on a chip together with the other control circuits, while the resistor Rfreq is an off-chip component coupled to the frequency control terminal Freq_pin via a pin of the chip. As can be obtained from the example of FIG. 1, the value of the reference current Ir1 is Vref2/Rfreq. Namely, when the resistor Rfreq is coupled to the frequency control terminal Freq_pin, the value of the reference current Ir1, further the frequency of the first clock signal CLK, could be regulated by regulating the resistance of the resistor Rfreq. When an external clock signal S_clk (i.e. a second clock signal) is provided at the frequency control terminal Freq_pin, the clock signal CLK is synced with the external clock signal S_clk.

However, at the moment the first clock signal CLK is synced with the second clock signal S_clk, the reference current Ir1 is approximately zero. With a sync selecting signal Sync controlling, the PLL 106 generates a sync current Ipll based on the phase difference between the first clock signal CLK and the second clock signal S_clk. At the moment the two clock signals CLK and S_clk are synced, the sync current Ipll is small, so is the charging current Ic1 of the capacitor C1. Thus, the capacitor C1 couldn't be charged fast enough and the first clock signal CLK is missing at the moment the clock signals CLK and S_clk are synced. As a result, the voltage converter stops switching and the output voltage of the voltage converter drops.

Figure 2:
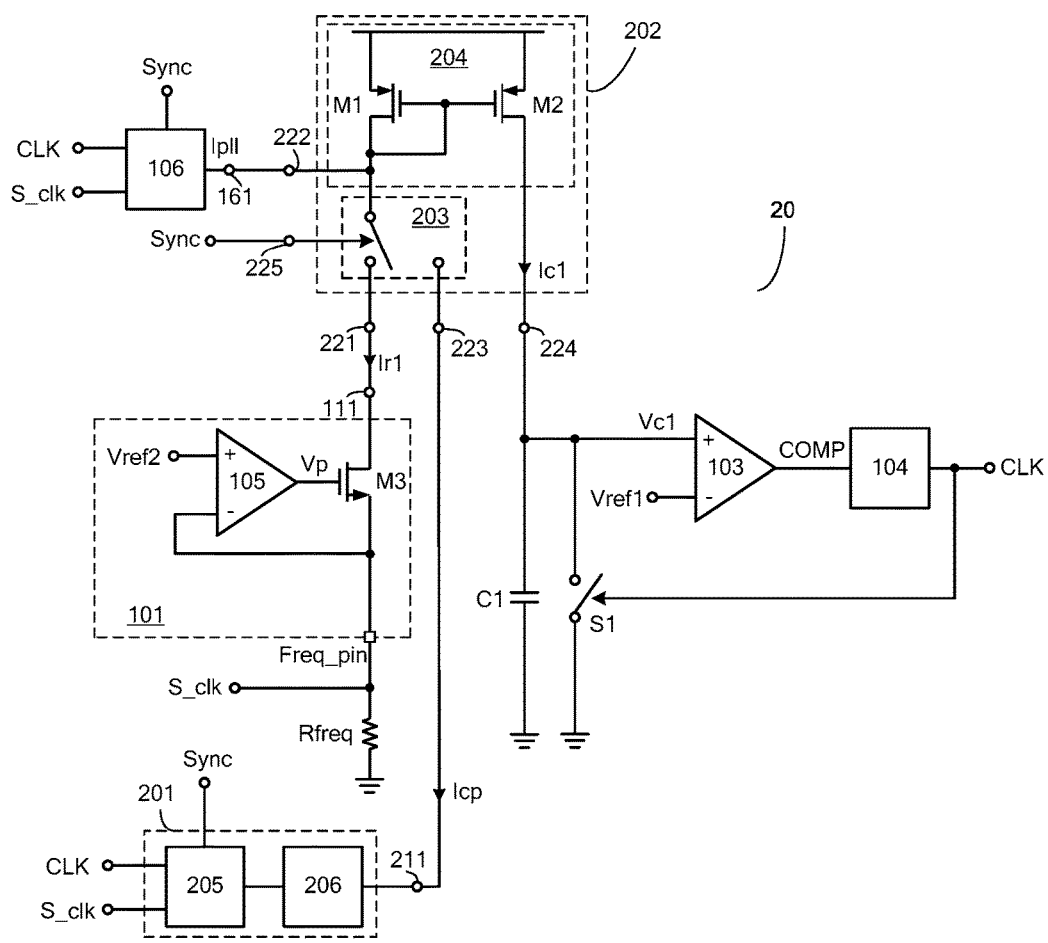
FIG. 2 schematically shows a clock circuit 20 in accordance with an embodiment of the present invention.

FIG. 2 schematically shows a clock circuit 20 in accordance with an embodiment of the present invention. Compared with the clock circuit 10, the clock circuit 20 further comprises a current compensation circuit 201. If the second clock signal S_clk is detected, the sync selecting signal Sync is valid; otherwise, the sync selecting signal Sync is invalid. When the sync selecting signal Sync is invalid, the current source 101 provides the reference current Ir1; when the sync selecting signal Sync is valid, the PLL 106 provides the sync current Ipll, and the current compensation circuit 201 provides a compensating current Icp.

In one embodiment, the clock circuit 20 comprises: the current source 101 having the frequency control terminal Freq_pin; the PLL 106, having a first input terminal configured to receive the first clock signal CLK, a second input terminal configured to receive the second clock signal S_clk, a control terminal configured to receive the sync selecting signal Sync, and an output terminal 161 configured to provide the sync current Ipll based on the first clock signal CLK, the second clock signal S_clk and the sync selecting signal Sync; the current compensation circuit 201, having a first input terminal configured to receive the first clock signal CLK, a second input terminal configured to receive the second clock signal S_clk, a control terminal configured to receive the sync selecting signal Sync and an output terminal 211 configured to provide the compensating current Icp based on the first clock signal CLK, the second clock signal S_clk and the sync selecting signal Sync; and a current control circuit 202, having a first input terminal coupled 221 to the output terminal 111 of the current source 101 to receive the reference current Ir1, a second input terminal 222 coupled to the output terminal 161 of the PLL 106 to receive the sync current Ipll, a third input terminal 223 coupled to the output terminal 211 of the current compensation circuit 201 to receive the compensating current Icp, a control terminal 225 configured to receive the sync selecting signal Sync, and an output terminal 224 configured to provide the charging current Ic1 proportional to the reference current Ir1 when the sync selecting signal Sync is invalid, and configured to provide the charging current Ic1 proportional to an arithmetic operation result of the sync current Ipll and the compensating current Icp when the sync selecting signal Sync is valid.

In one embodiment, the resistor Rfreq is a discrete component.

In one embodiment, the resistor Rfreq and the clock circuit 20 are integrated in a same chip.

In one embodiment, an add operation is performed to the sync current Ipll and the compensating current Icp.

In one embodiment, a direction of the compensating current Icp is from the current control circuit 202 to the current compensation circuit 201.

In one embodiment, the direction of the sync current Ipll is changeable. When the frequency of the first clock signal CLK is lower than that of the second clock signal S_clk, the direction of the sync current Ipll is from the current control circuit 202 to the PLL 106; when the frequency of the first clock signal CLK is higher than that of the second clock signal S_clk, the direction of the sync current Ipll is from the PLL 106 to the current control circuit 202.

In the description of the present invention, the sync current Ipll and the compensating current Icp are both defined as positive when they are flowing out of the current control circuit 202, and as negative when they are flowing into the current control circuit 202.

In one embodiment, the clock circuit 20 further comprises: the capacitor C1, having a first terminal coupled to the output terminal of the current control circuit 202 to receive the charging current Ic1, and a second terminal coupled to a ground reference ; the discharging switch S1, in parallel with the capacitor C1, having a first terminal, a second terminal, and a control terminal configured to receive the first clock signal CLK; the comparator 103, having a first input terminal configured to receive the first reference signal Vref1, a second input terminal coupled to the first terminal of the capacitor C1 to receive the voltage Vc1 across the capacitor C1, and an output terminal configured to generate the comparison signal COMP based on the voltage Vc1 across the capacitor C1 and the first reference signal Vref1; and the pulse circuit 104, having an input terminal coupled to the output terminal of the comparator 103 to receive the comparison signal COMP, and an output terminal configured to generate the first clock signal CLK based on the comparison signal COMP.

The operating principle of the clock circuit 20 is similar to that of the clock circuit 10, and is not described here for brevity.

In one embodiment, the circuit control circuit 202 comprises: a current selecting circuit 203, having a first input terminal coupled to the output terminal 111 of the current source 101, a second input terminal coupled to the output terminal 211 of the current compensation circuit 201, a control terminal configured to receive the sync selecting signal Sync, and an output terminal configured to provide the reference current Ir1 when the sync selecting signal Sync is invalid, and to provide the compensating current Icp when the sync selecting signal Sync is valid; and a current mirror 204, having an input terminal coupled to both of the output terminal of the current selecting circuit 203 and the output terminal 161 of the PLL 106, and an output terminal configured to provide the charging current Ic1 proportional to a current from the input terminal of the current mirror 204, wherein the input terminal of the current mirror 204 is configured to receive the reference current Ir1 when the sync selecting signal Sync is invalid, and to receive the sum of the sync current Ipll and the compensating current Icp when the sync selecting signal Sync is valid.

In one embodiment, the current mirror 204 comprises the MOSFETs M1 and M2.

In one embodiment, the current transfer ratio of the current mirror 204 is 1:1. Namely, the charging current Ic1 equals to the reference current Ir1 when the sync selecting signal Sync is invalid, and equals to the sum of the sync current Ipll and the compensating current Icp, i.e. Ipll+Icp, when the sync selecting signal Sync is valid.

In one embodiment, when the frequency of the first clock signal CLK is lower than that of the second clock signal S_clk, the sync current Ipll is positive, so that the sum of the sync current Ipll and the compensating current Icp, i.e. Ipll+Icp, is larger than the compensating current Icp, namely the charging current Ic1 increases; when the frequency of the first clock signal CLK is higher than that of the second clock signal S_clk, the sycn current Ipll is negative, so that the sum of the sync current Ipll and the compensating current Icp, i.e. Ipll+Icp, is smaller than the compensating current Icp, namely the charging current Ic1 decreases.

In other embodiments, the current mirror 204 may have other appropriate current transfer ratios according to requirements of specific applications.

In one embodiment, the current compensation circuit 201 comprises: a frequency selecting circuit 205, having a first input terminal configured to receive the first clock signal CLK, a second input terminal configured to receive the second clock signal S_clk, a control terminal configured to receive the sync selecting signal Sync, and an output terminal configured to provide the first clock signal CLK when the sync selecting signal Sync is invalid, and configured to provide the second clock signal S_clk when the sync selecting signal Sync is valid; and a frequency-to-current converter 206, having an input terminal coupled to the output terminal of the frequency selecting circuit 205 to receive the output signal of the frequency selecting circuit 205, and an output terminal configured to provide the compensating current Icp based on the output signal of the frequency selecting circuit 205.

In an embodiment, the value of the compensating current Icp is proportional to the frequency of the first clock signal CLK or the frequency of the second clock signal S_clk. That is, the higher the frequency of the clock signal provided to the frequency-to-current converter 204 (namely the first clock signal CLK or the second clock signal S_clk), the larger the compensating current Icp.

Figure 3:
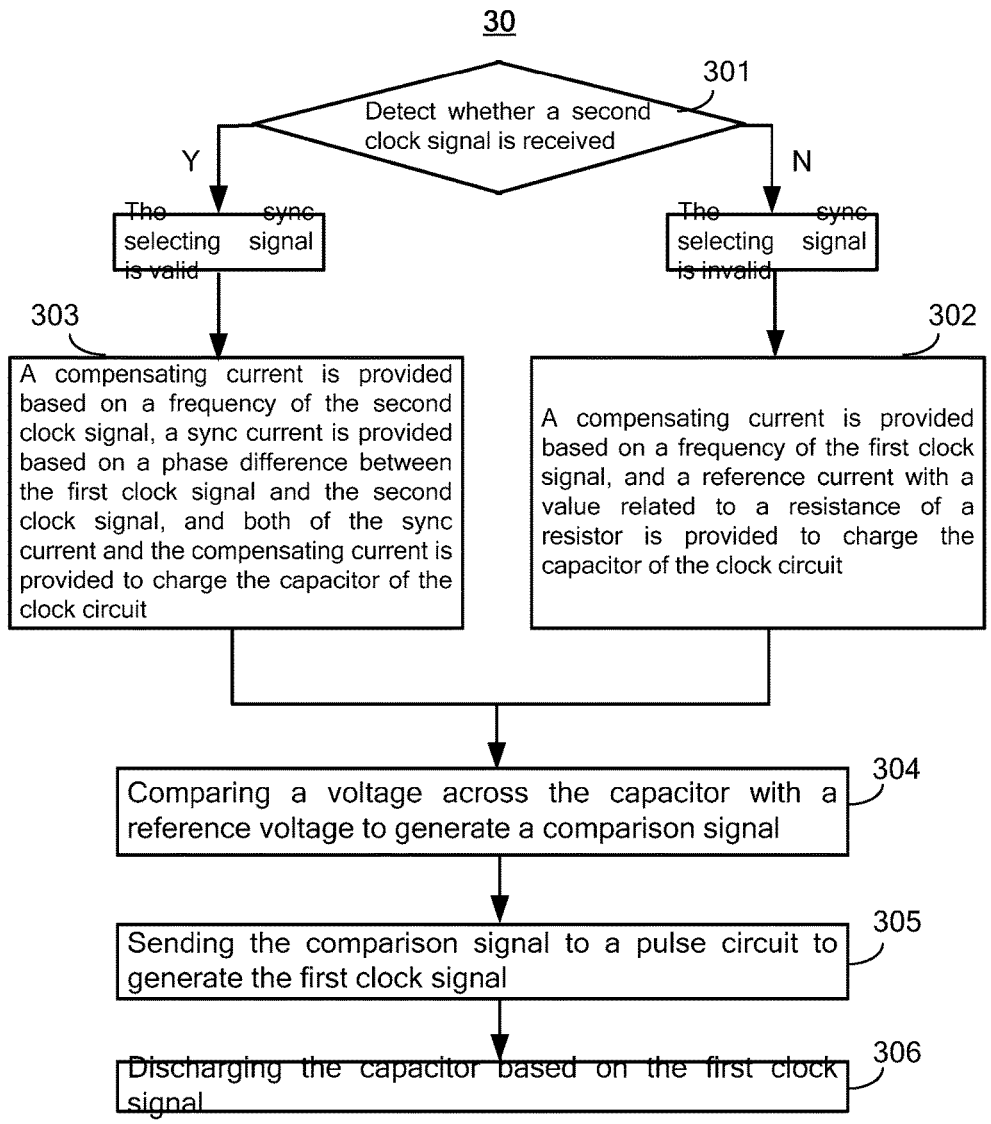
FIG. 3 shows a flow diagram of a method of controlling a clock circuit in accordance with an embodiment of the present invention.

FIG. 3 shows a flow diagram of a method 30 of controlling a clock circuit in accordance with an embodiment of the present invention. The clock circuit provides a first clock signal, wherein the clock circuit comprises a frequency control terminal coupled to a resistor or to receive a second clock signal, comprising: step 301, detecting whether a second clock signal is received, if the second clock signal is received, the sync selecting signal is valid, otherwise the sync selecting signal is invalid; step 302, when the sync selecting signal is invalid, generating a compensating current based on a frequency of the first clock signal, and providing a reference current with a value related to the resistance of the resistor to charge a capacitor of the clock circuit; step 303, when the sync selecting signal is valid, generating a compensating current based on a frequency of the second clock signal, generating a sync current based on a phase difference between the first clock signal and the second clock signal, and providing both of the sync current and the compensating current to charge the capacitor of the clock circuit; step 304, comparing a voltage across the capacitor with a reference voltage to generate a comparison signal; step 305, sending the comparison signal to a pulse circuit to generate the first clock signal; step 306, discharging the capacitor based on the first clock signal.

In one embodiment, the value of the reference current is inversely proportional to inverse proportion with the resistance of the resistor.

In the clock circuit disclosed by the present invention, when a clock signal generated by the clock circuit is synced with an external clock signal, a compensating current related to a frequency of the external clock signal is provided by a compensation circuit to charge a capacitor of the clock circuit, so as to avoid missing the clock signal due to the small charging current of the capacitor at the moment. Consequently, output voltage drop of a voltage converter adopting the clock signal is avoided too.

While specific embodiments of the present invention have been provided, it is to be understood that these embodiments are for illustration purposes and not limiting. Since the invention can be practiced in various forms without distracting the spirit or the substance of the invention, it should be understood that the above embodiments are not confined to any aforementioned specific detail, but should be explanatory broadly within the spirit and scope limited by the appended claims. Thus, all the variations and modification falling into the scope of the claims and their equivalents should be covered by the appended claims.

What is claimed is:

1. A clock circuit, comprising:
a current source, having a frequency control terminal and an output terminal, wherein when the frequency control terminal is coupled to a resistor, the output terminal provides a reference current with a value related to a resistance of the resistor;
a phase lock loop (PLL), having a first input terminal configured to receive a first clock signal, a second input terminal configured to receive a second clock signal, a control terminal configured to receive a sync selecting signal, and an output terminal configured to provide a sync current based on the first clock signal, the second clock signal and the sync selecting signal;
a current compensation circuit, having a first input terminal configured to receive the first clock signal, a second input terminal configured to receive the second clock signal, a control terminal configured to receive the sync selecting signal, and an output terminal configured to provide a compensating current based on the first clock signal, the second clock signal and the sync selecting signal; and
a current control circuit, having a first input terminal coupled to the output terminal of the current source to receive the reference current, a second input terminal coupled to the output terminal of the PLL to receive the sync current, a third input terminal coupled to the output terminal of the current compensation circuit to receive the compensating current, a control terminal configured to receive the sync selecting signal, and an output terminal configured to provide the charging current based on the reference current when the sync selecting signal is invalid, and to provide the charging current based on the sync current and the compensating current when the sync selecting signal is valid.

2. The clock circuit of claim 1, further comprising:
a capacitor, having a first terminal coupled to the output terminal of the current control circuit to receive the charging current, and a second terminal coupled to a ground reference;
a discharging switch coupled in parallel with the capacitor, having a first terminal, a second terminal, and a control terminal configured to receive the first clock signal;
a comparator, having a first input terminal configured to receive the first reference signal, a second input terminal coupled to the first terminal of the capacitor to receive a voltage across the capacitor, and an output terminal configured to generate a comparison signal based on the voltage across the capacitor and the first reference signal; and
a pulse circuit, having an input terminal coupled to the output terminal of the comparator to receive the comparison signal, and an output terminal configured to generate the first clock signal based on the comparison signal.

3. The clock circuit of claim 1, wherein the current compensation circuit comprises:
a frequency selecting circuit, having a first input terminal configured to receive the first clock signal, a second input terminal configured to receive the second clock signal, a control terminal configured to receive the sync selecting signal, and an output terminal configured to provide the first clock signal when the sync selecting signal is invalid, and to provide the second clock signal when the sync selecting signal is valid; and
a frequency-to-current converter, having an input terminal coupled to the output terminal of the frequency selecting circuit, and an output terminal configured to provide the compensating current based on the first clock signal or the second clock signal provided by the frequency selecting circuit.

4. The clock circuit of claim 1, wherein the current control circuit comprises:
a current selecting circuit, having a first input terminal coupled to the output terminal of the current source, a second input terminal coupled to the output terminal of the current compensation circuit, a control terminal configured to receive the sync selecting signal, and an output terminal configured to provide the reference current when the sync selecting signal is invalid, and to provide the compensating current when the sync selecting signal is valid; and a current mirror, having an input terminal coupled to both of the output terminal of the current selecting circuit and the output terminal of the PLL, and an output terminal configured to provide the charging current based on a current from the input terminal of the current mirror;

wherein the input terminal of the current mirror receives the reference current when the sync selecting signal is invalid, and receives both of the sync current and the compensating current when the sync selecting signal is valid.

5. The clock circuit of claim 1, wherein the resistor coupled to the frequency control terminal of the current source is an off-chip component.

6. The clock circuit of claim 1, wherein the resistor coupled to the frequency control terminal of the current source is integrated in a same chip with the clock circuit.

7. The clock circuit of claim 1, wherein the current source comprises:
- an error amplifier, having a first terminal configured to receive a second reference voltage, a second terminal coupled to the frequency control terminal, and an output terminal configured to provide an amplified signal based on the second reference voltage and a signal at the frequency control terminal;
- a MOSFET, having a first terminal coupled to the output terminal of the current source, a second terminal coupled to the frequency control terminal, and a control terminal coupled to the output terminal of the error amplifier.

8. A method of controlling a clock circuit for generating a first clock signal, wherein the clock circuit comprises a frequency control terminal configured to either be coupled to a resistor or receive a second clock signal, comprising:
- detecting whether the second clock signal is received, if the second clock signal is received, the sync selecting signal is valid, otherwise the sync selecting signal is invalid;
- when the sync selecting signal is invalid, generating a compensating current based on a frequency of the first clock signal, and providing a reference current with a value related to a resistance of the resistor to charge a capacitor of the clock circuit;
- when the sync selecting signal is valid, generating a compensating current based on the second clock signal, generating a sync current based on a phase difference between the first clock signal and the second clock signal, and providing both of the sync current and the compensating current to charge the capacitor of the clock circuit;
- comparing a voltage across the capacitor with a reference voltage to generate a comparison signal;
- providing the comparison signal to a pulse circuit to generate the first clock signal; and
- discharging the capacitor based on the first clock signal.

9. The method of claim 8, wherein the resistor coupled to the frequency control terminal of the current source is an off-chip component.

10. The method of claim 8, wherein the resistor to which the frequency control terminal is coupled is integrated in a same chip with the clock circuit.

11. A clock circuit, comprising:
- a resistor, having a first terminal coupled to a ground reference, and a second terminal;
- a current source, having a frequency control terminal coupled to the second terminal of the resistor, and an output terminal configured to provide a reference current with a value related to the resistance of the resistor;
- a phase lock loop (PLL), having a first input terminal configured to receive a first clock signal, a second input terminal configured to receive a second clock signal, a control terminal configured to receive a sync selecting signal, and an output terminal configured to provide a sync current based on the first clock signal, the second clock signal and the sync selecting signal;
- a current compensation circuit, having a first input terminal configured to receive the first clock signal, a second input terminal configured to receive the second clock signal, a control terminal configured to receive the sync selecting signal, and an output terminal configured to provide a compensating current based on the first clock signal, the second clock signal and the sync selecting signal; and
- a current control circuit, having a first input terminal coupled to the output terminal of the current source to receive the reference current, a second input terminal coupled to the output terminal of the PLL to receive the sync current, a third input terminal coupled to the output terminal of the current compensation circuit to receive the compensating current, a control terminal configured to receive the sync selecting signal, and an output terminal configured to provide the charging current based on the reference current when the sync selecting signal is invalid, and to provide the charging current based on the sync current and the compensating current when the sync selecting signal is valid.

12. The clock circuit of claim 11, further comprising:
- a capacitor, having a first terminal coupled to the output terminal of the current control circuit to receive the charging current, and a second terminal coupled to a ground reference;
- a discharging switch coupled in parallel with the capacitor, having a first terminal, a second terminal, and a control terminal configured to receive the first clock signal;
- a comparator, having a first input terminal configured to receive the first reference signal, a second input terminal coupled to the first terminal of the capacitor to receive a voltage across the capacitor, and an output terminal configured to generate a comparison signal based on the voltage across the capacitor and the first reference signal; and
- a pulse circuit, having an input terminal coupled to the output terminal of the comparator to receive the comparison signal, and an output terminal configured to generate the first clock signal based on the comparison signal.

13. The clock circuit of claim 11, wherein the current compensation circuit comprises:
- a frequency selecting circuit, having a first input terminal configured to receive the first clock signal, a second input terminal configured to receive the second clock signal, a control terminal configured to receive the sync selecting signal, and an output terminal configured to provide the first clock signal when the sync selecting signal is invalid, and to provide the second clock signal when the sync selecting signal is valid; and
- a frequency-to-current converter, having an input terminal coupled to the output terminal of the frequency selecting circuit, and an output terminal configured to provide the compensating current based on the first clock signal or the second clock signal provided by the frequency selecting circuit.

14. The clock circuit of claim 11, wherein the current control circuit comprises:
- a current selecting circuit, having a first input terminal coupled to the output terminal of the current source, a second input terminal coupled to the output terminal of the current compensation circuit, a control terminal configured to receive the sync selecting signal and an output terminal configured to provide the reference current when the sync selecting signal is invalid, and to provide the compensating current when the sync selecting signal is valid; and
- a current mirror, having an input terminal coupled to both of the output terminal of the current selecting circuit and the output terminal of the PLL, and an output terminal configured to provide the charging current based on a current from the input terminal of the current mirror;
- wherein the input terminal of the current mirror receives the reference current when the sync selecting signal is invalid, and receives both of the sync current and the compensating current when the sync selecting signal is valid.

* * * * *